United States Patent
Matsuura

(10) Patent No.: US 6,521,984 B2
(45) Date of Patent: Feb. 18, 2003

(54) SEMICONDUCTOR MODULE WITH SEMICONDUCTOR DEVICES ATTACHED TO UPPER AND LOWER SURFACE OF A SEMICONDUCTOR SUBSTRATE

(75) Inventor: Tetsuya Matsuura, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/828,979

(22) Filed: Apr. 10, 2001

(65) Prior Publication Data

US 2002/0053723 A1 May 9, 2002

(30) Foreign Application Priority Data

Nov. 7, 2000 (JP) .................................... 2000-339192

(51) Int. Cl.[7] .............................................. H01L 23/02
(52) U.S. Cl. .................. 257/678; 257/668; 257/724; 257/738; 257/777; 324/754; 365/63
(58) Field of Search ........................... 324/754; 365/63; 327/686, 780, 778, 737, 696

(56) References Cited

U.S. PATENT DOCUMENTS 5,847,985 A * 12/1998 Mitani et al. ............... 361/686
5,977,783 A * 11/1999 Takayama et al. .......... 324/754

FOREIGN PATENT DOCUMENTS

| GB | 2 237 691 | 5/1991 |
| JP | 10-074885 | 3/1998 |
| JP | 11-008347 | 1/1999 |

* cited by examiner

Primary Examiner—David Nelms
Assistant Examiner—Mai-Huong Tran
(74) Attorney, Agent, or Firm—McDermott, Will & Emery

(57) ABSTRACT

The present invention provides an inexpensive semiconductor module of large capacity capable of being formed into a small-sized semiconductor module without using any special assembling component irrespective of thickness of a semiconductor device to be packaged therein. A semiconductor module unit 6 is formed by packaging a bump electrode 3 of a semiconductor device 4 in electrode pad 5*a* that are disposed on upper and lower faces of a unit substrate 5. A mother substrate 17 is provided with upper and lower faces on which an electrode pad 17*d* of a circuit pattern is formed, and a center part in which welding balls of same diameter can be packaged. A semiconductor module unit 6 is arranged on both faces of the mother substrate 17 so that the semiconductor devices 4 may be inserted back to back with a small distance between them. The unit substrate 5 and the electrode pads 5*b*, 17*d* of the mother substrate 17 are conductively connected through a connection bump 18.

6 Claims, 4 Drawing Sheets

SEMICONDUCTOR MODULE WITH SEMICONDUCTOR DEVICES ATTACHED TO UPPER AND LOWER SURFACE OF A SEMICONDUCTOR SUBSTRATE

BACKGROUND OF THE INVENTION

1. Technical Field

The present invention relates to a small-sized and inexpensive semiconductor module of large capacity, in which a semiconductor module unit packaged with a semiconductor device is compactly packaged on a mother substrate.

2. Background Art

It is a recent trend that varieties of electronic equipment and instrument small in size, light in weight and large in capacity have been increasingly demanded, and to meet such a demand, various types of semiconductor modules have been developed.

FIG. 5 is a sectional view showing a construction of a semiconductor module according to one of prior arts. In the drawing, reference numeral 10 is a semiconductor module. This conventional module 10 is arranged in the following manner. First, a semiconductor chip (not illustrated) is joined to a substrate 2, and an electrode thereof and an electrode pad (not illustrated) of a circuit pattern formed on the substrate 2 are conductively connected through a thin metal wire (not illustrated). Then, they are sealed together with a semiconductor chip portion 1 with a resin. Bump electrode 3 for a CSP (chip size package) type semiconductor device 4 are conductively connected to required electrode pads 5a of the circuit pattern formed on upper and lower faces of a unit substrate 5. The bump electrodes 3 serve as an external terminal disposed on the lower face of the substrate 2 conductively connected to the mentioned circuit pattern. Thus, a semiconductor unit module 6 is formed. Further, an electrode pad 5b conducting to the electrode pad 5a is conductively connected to electrode pads 7a of the circuit pattern formed on upper and lower faces of a mother substrate 7 through connecting bumps 8. Thus, a conventional semiconductor module 10 is obtained.

In the semiconductor module 10 of above construction, for the arrangement of the connecting bumps 8, it is required to specially prepare welding balls of large diameter (not smaller than about 1.5 mm in φ) exceeding normal diameter (normally 0.5 to 0. 8 mm in φ) for each semiconductor module 10 in conformity with thickness of the CSP type semiconductor device 4, which eventually results in a high manufacturing cost. Note that, generally, number of the bump electrodes 3 serving as external terminal is same as that of the connecting bumps 8. The CSP type semiconductor device 4 is usually applied to a semiconductor module having not less than 60 pins. Therefore, when diameter of the welding balls for the connecting balls 8 is large, the unit substrate 5 is obliged to be large-sized in view of designing the wiring pattern on the unit substrate 5. In the worst case, there is a possibility that size of the unit substrate 5 is equivalent to or larger than that of the mother substrate 7. In such a case, there remains no space enough to package other circuit components (such as capacitor, resistor) on the mother substrate 7, and it becomes impossible to arrange a semiconductor module. Thus, a problem exists in that it is inevitable for the mother substrate 7 to be further large-sized.

SUMMARY OF THE INVENTION

The present invention was made to solve the above-discussed problems and has an object of providing an inexpensive semiconductor module of large capacity capable of being formed into a small-sized.semiconductor module without using any special assembling component irrespective of thickness of a semiconductor device to be packaged therein.

To accomplish the foregoing object, a semiconductor module according to the invention comprises: a semiconductor module unit in which external terminals of semiconductor devices are packaged in electrode pads of a unit substrate on upper and lower faces of which electrode pads of a circuit pattern are disposed; a mother substrate on upper and lower faces of which electrode pads of the circuit pattern are packaged and which is provided with.either concave portions or through holes, each having a depth enough to insert each semiconductor device of the semiconductor module unit disposed on upper and lower faces of the mentioned electrode pads; and a first conductive connector for conductively connecting the electrode pads of the unit substrate conducting to the electrode pads packaged with the external terminals of the semiconductor devices and the electrode.pads of the mother substrate.

As a result of such construction, diameter of the first conductive connector can be small-sized, and a small-sized semiconductor module can be obtained.

It is preferable that the unit substrate of the mentioned semiconductor module is comprised of a main substrate on upper and lower faces of which the electrode pads of the circuit pattern packaged with the external terminals of the semiconductor devices are disposed, and a spacer forming a concave portion having a depth enough to surround the semiconductor devices disposed on one face of the mentioned main substrate and packaged in the mentioned one face; in which the main substrate and the spacer are provided with through holes conducting to the electrode pads and of which upper and lower ends are exposed; and plural semiconductor module units provided with said unit substrate and the semiconductor devices, packaged in the mentioned unit substrate are disposed in such a manner as to be stacked in order under the condition that the semiconductor devices of the other semiconductor module units are inserted in the concave portion of the unit substrate so that through holes of each semiconductor module unit are conductively connected to one another through a second conductive connector.

As a result of such construction, a small-sized semiconductor module of a larger capacity can be obtained.

It is also preferable that the depth of the concave portion or the through holes of the mother substrate is established to be a depth in which the semiconductor devices inserted in the concave portions or the through holes of the mother substrate are disposed back to back with a space between each semiconductor device and a bottom face of each concave portion of the mother substrate or with a space between the semiconductor devices..

It is also preferable that the depth of the concave portion of the unit substrate of the semiconductor module unit is established to be a depth in which one semiconductor device inserted in the concave portions of the unit substrate of one semiconductor module unit is disposed back to back with another semiconductor device of another semiconductor module unit with a space between the semiconductor devices.

Another semiconductor module according to the invention comprises: plural semiconductor module units in which external terminals of semiconductor devices are packaged in electrode pads of a unit substrate on upper and lower faces of which electrode pads of a circuit pattern are disposed; a mother substrate on upper and lower faces of which electrode pads of the circuit pattern is disposed and the mentioned plural semiconductor module units are vertically disposed; and a conductive connector for conductively connecting the electrode pads of the unit substrate conducting to the electrode pads packaged with the external terminals of the semiconductor devices and the electrode pads of the mother substrate.

As a result of such construction, a small-sized semiconductor module of a larger capacity can be obtained.

It is also preferable that the semiconductor devices of the semiconductor module are CSP type semiconductor devices.

DESCRIPTION OF THE PREFERRED EMBODIMENTS

Embodiment 1

Figure 1:
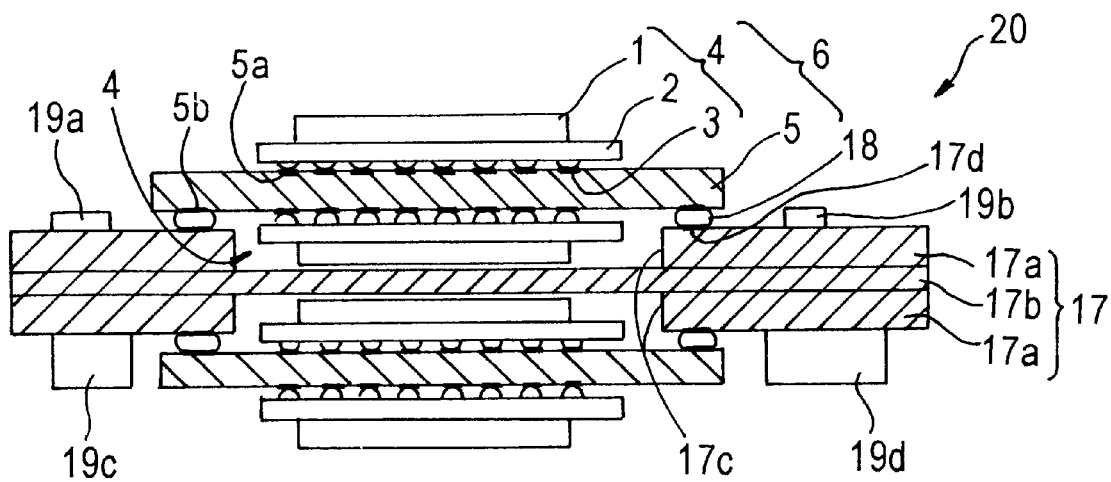
FIG. 1 is a sectional view of a semiconductor module according to Embodiment 1 of the present invention.

An embodiment of the present invention is hereinafter described. FIG. 1 is a sectional view of a semiconductor module according to Embodiment 1 of the present invention. Throughout the drawings, the same reference numerals are designated to the same or like parts. Referring to FIG. 1, reference numeral 17 is a mother substrate on upper and lower face of which a circuit pattern (not illustrated) and an electrode pad 17d are formed and in which a semiconductor module unit 6 is packaged by a connecting bump 18 serving as a first conductive connector. Numeral 17c is a concave provided in the center part of the upper and lower faces of the mother substrate 17. Depth of the concave is decided so that the bump electrode 3 and the connecting bump 18 of the semiconductor device 4 can be packaged with the use of welding balls of same normal diameter. Accordingly, a pair of semiconductor module units 6 is arranged on the upper and lower faces of the mother substrate 17, and semiconductor devices 4 on one side of each semiconductor module unit 6 are inserted back to back with a small distance between them. Under this condition, the electrode pad 5a of the unit substrate 5 and the electrode pad 17d of the mother substrate 17 are conductively connected by welding through the connection bump using welding balls of normal diameter (φ0.5 to 0.8 mm).

Thus, in this Embodiment 1, the bump electrode 3 and the connecting bump 18 are packaged in the mother substrate 17 using the welding balls of same normal diameter. The mother substrate is provided with the concave 17c having a certain depth which is enough to allow the semiconductor devices 4 to be arranged back to back with a small space between them. As a result, irrespective of thickness of the semiconductor devices 4, a compact semiconductor module 20 can be constructed without preparing any connecting bump of special size. After all it becomes possible to obtain a small-sized and inexpensive semiconductor module of a large capacity. In addition, numerals 19a, 19b, 19c and 19d are respectively circuit parts including capacitor, resistor, and other semiconductor device packaged on the upper and lower faces of the mother substrate 17.

To form the mother substrate 17, a perforated substrate 17a having perforation to form the concave 17c on both main faces of a core substrate 17b is prepared by heating and press-fitting through a prepreg (not illustrated) that is an adhesive sheet composed of epoxy resin and glass fiber. Then a required circuit pattern and the electrode pad 17d, etc. thereof are formed on upper and lower sides by the known process.

Embodiment 2

Figure 2:
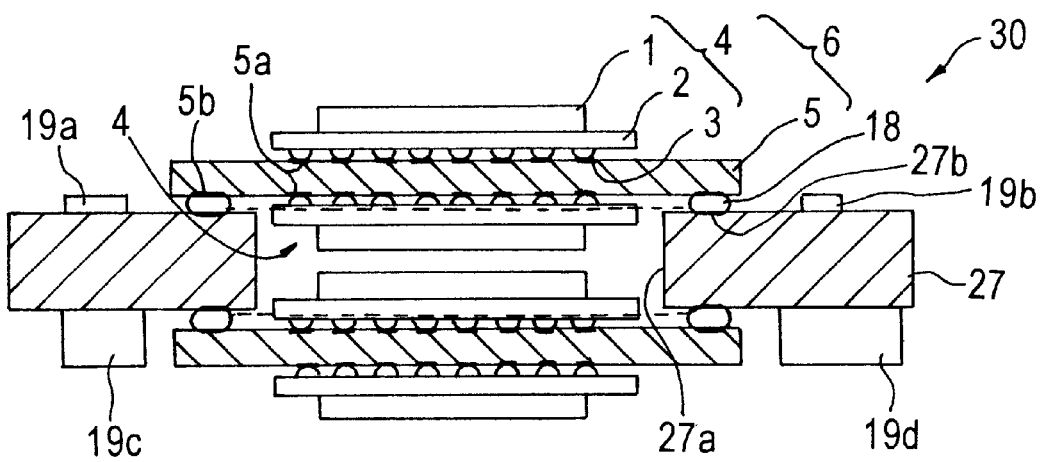
FIG. 2 is a sectional view of a semiconductor module according to Embodiment 2 of the invention.

FIG. 2 is a sectional view of a semiconductor module according to Embodiment 2 of the invention. Referring to FIG. 2, reference numeral 27 is a mother substrate on upper and lower face of which a circuit pattern and an electrode pad 27b are formed and in which a semiconductor module unit 6 is packaged by a connecting bump 18 serving as a first conductive connector. Numeral 27a is a through hole provided in the center part of the mother substrate 27. This through hole 27a is provided by numerical control (NC) cutting with a drill. A pair of semiconductor module units 6 is disposed on upper and lower faces of the mother substrate 27, and semiconductor devices 4 on one side of each semiconductor module unit 6 are inserted in the through hole 27a to be packaged. The remaining arrangement is the same as in the foregoing Embodiment 1. However, the portion where the semiconductor devices 4 are inserted in the mother substrate 27 is formed into a through hole. As a result, it becomes possible to arrange a semiconductor module 30 similar to that in the foregoing Example 1, packaging the semiconductor module unit 6 in which semiconductor devices 4 are thicker than those in the foregoing Embodiment 1. The remaining features and advantages are the same as those in the foregoing Embodiment 1.

Embodiment 3

Figure 3:
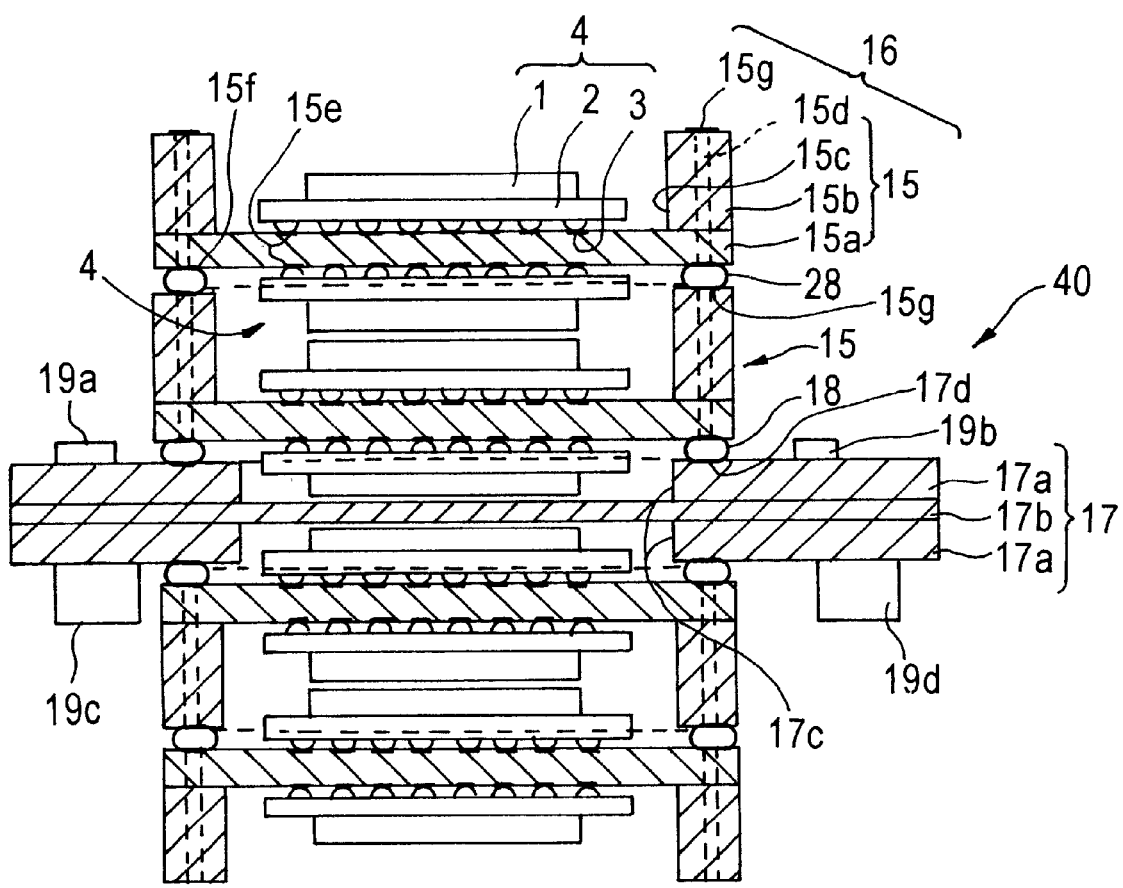
FIG. 3 is a sectional view of a semiconductor module according to Embodiment 3 of the invention.

FIG. 3 is a sectional view of a semiconductor module according to Embodiment 3 of the invention. Referring to FIG. 3, reference numeral 15 is a unit substrate. This unit substrate 15 is comprised of main substrate 15a on upper and lower faces of which a circuit pattern (not illustrated) and electrode pads 15e, 15f are formed, and a spacer 15b forming a concave 15c of a required depth at the center part. The main substrate 15a and the spacer 15b are heated and press-fitted through a prepreg being an adhesive sheet composed of epoxy resin and glass fiber, and the mentioned circuit pattern and the electrode pads 15e, 15f are formed by the known process. Numeral 15d are plural through holes provided through the main substrate 15a and the spacer 15b with upper and lower ends exposed. The through holes 15d are conductively connected respectively to each of the pad electrodes 15e through pattern wiring. On the surface of the main substrate 15a and the spacer 15b, electrode pads 15f, 15g are disposed. A semiconductor module unit 16 is comprised of semiconductor devices 4 and unit substrates 15, and the bump electrode 3 serving as external terminal of the semiconductor devices 4 is conductively connected to the electrode pad 15e and the main substrate 15a. In this semiconductor module 40, the semiconductor module unit 16 of above construction is disposed on upper and lower faces of the mother substrate 17. Then the electrode pad 15f and the electrode pad 17d are conductively connected through the connecting bump 18. Then the electrode pad 15f of the next semiconductor module unit 16 is disposed on the electrode pad 15g of the semiconductor module unit 16, and the electrode pad 15g and the electrode pad 15f are conductively connected through the connecting bump 28 serving as a second conductive connector. In this manner, the semiconductor module units 16 are conductively connected forming a multistage package. Therefore, it is possible to decide depth of the concave 15c so as to be packaged through the connecting bump 18 with the use of welding balls of same normal diameter ($\phi$0.5 to 0.8 mm).

As a result of employing the above construction, the external terminals (bump electrode 3) common in the semiconductor devices 4 of the semiconductor module unit 16 conductively connected are commonly connected by the through hole 15d, and connected to outside circuit through the output terminal (not illustrated) of the mother substrate 17.

In this manner, it is possible to completely form a semiconductor module 40 comprising the multi-stage packaged semiconductor module units 16 comprised of the semiconductor devices 4, unit substrate 15, mother substrate 17, and connecting bumps 18, 28.

In this Embodiment 3, since the semiconductor module 40 is arranged as described above, it becomes possible to obtain a small-sized and inexpensive semiconductor module of a large capacity. In this Embodiment 3, it is also preferable to use the mother substrate 27 provided with a through hole 27a employed in the foregoing Embodiment 2. In this Embodiment 3, two stages are formed on the upper and lower sides of the mother substrate 17. However, number of stages formed by packaging the semiconductor module units 16 is not limited to the two stages, and it is also preferable to form more than two stages as a matter of course.

Embodiment 4

Figure 4:
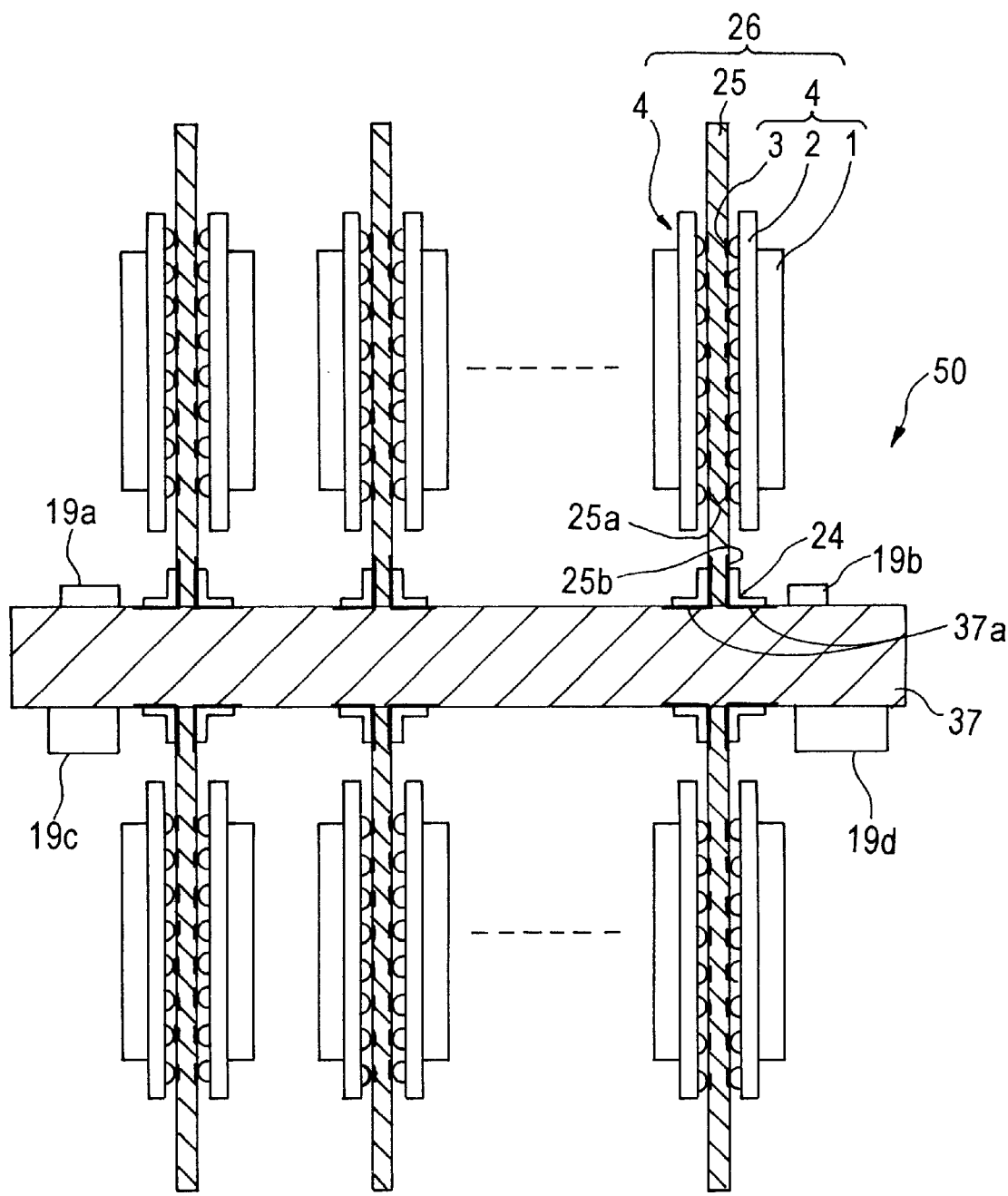
FIG. 4 is a sectional view of a semiconductor module according to Embodiment 4 of the invention.
Figure 5:
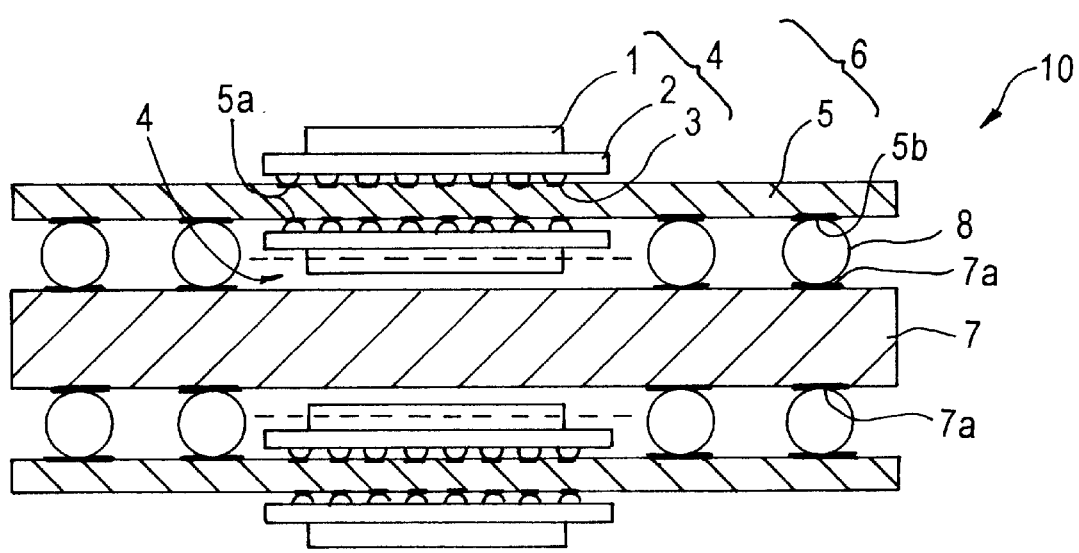
FIG. 5 is a sectional view showing a construction of a semiconductor module according to the prior art.

FIG. 4 is a sectional view of a semiconductor module according to Embodiment 4 of the invention. Referring to FIG. 4, numeral 26 is a semiconductor module unit. This semiconductor module unit 26 is comprised of a unit substrate 25 on two faces of which a circuit pattern (not illustrated) and electrode pads 25a, 25b are formed, and a bump electrode 3 serving as an external terminal of the semiconductor devices 4 and conductively connected to the electrode pad 25a of the unit substrate 25. The electrode pad 25b and the electrode pad 25a are conductively connected to each other through pattern wiring. Numeral 37 is a mother substrate on both faces of which a circuit pattern (not illustrated) and an electrode pad 37a are disposed. Numeral 24 is an L-shaped connector serving as connecting conductor of the module unit 26, and through which an electrode pad 25b and an electrode pad 37a are conductively connected. As for the L-shaped connectors 24, connecting pieces of thin copper plate of about 0.5 mm in width are placed at a pitch of about 1.0 mm, and each connecting piece is bent into L-shape, thus connecting members with their part integrally connected by a frame being preliminarily prepared. The connecting members are positioned and welded onto each electrode pad 25b formed on the unit substrate 25 at the same pitch as the L-shaped connectors 24. Then the frame is cut out, and the L-shaped connector 24 is attached to left and right sides of the unit substrate 25. Under such condition, the semiconductor module unit 26 erected on the mother substrate 37 using a paste, after positioning by means of jig each L-shaped connector 24 on each electrode pad 37a formed by known printing method. The entire unit is then inserted in a heating furnace to carry out a reflow, thereby fixing each L-shaped connector 24 to each electrode pad 37a. Thus, a semiconductor module 50 is completely assembled.

In the above semiconductor module 50 in which the semiconductor module unit 26 is packaged so as to be erected on the mother substrate 37, when packaging sixteen (thirty two CSP type semiconductor devices 4) semiconductor module units 26 on both faces of the mother substrate 37 for example, an area required for the mother substrate is reduced to about ¼ as compared with the semiconductor modules 20, 30 of stacking structure shown in the foregoing Embodiments 1 and 2. That is, in this Embodiment 4, it is no doubt that it becomes possible to obtain a small-sized semiconductor module of a large capacity having a further high package density.

What is claimed is:

1. A semiconductor module comprising:
   a semiconductor module unit in which external terminals of semiconductor devices are packaged in electrode pads of a unit substrate on upper and lower faces of which electrode pads of a circuit pattern are disposed;
   a mother substrate on upper and lower faces of which electrode pads of the circuit pattern are packaged and which is provided with either concave portions or through-holes, each having a depth enough to insert each semiconductor device of the semiconductor module unit disposed on upper and lower faces of the mentioned electrode pads; and
   a first conductive connector for conductively connecting the electrode pads of the unit substrate conducting to said electrode pads packaged with the external terminals of said semiconductor devices and the electrode pads of said mother substrate.

2. The semiconductor module according to claim 1;
   wherein the unit substrate of the mentioned semiconductor module is comprised of a main substrate on upper and lower faces of which the electrode pads of the circuit pattern packaged with the external terminals of the semiconductor devices are disposed, and a spacer forming a concave portion having a depth enough to surround said semiconductor devices disposed on one face of the mentioned main substrate and packaged in the mentioned one face; and
   wherein said main substrate and said spacer are provided with through holes conducting to said electrode pads and of which upper and lower ends are exposed; and plural semiconductor module units provided with said unit substrate and the semiconductor devices packaged in said unit substrate are disposed in such a manner as to be stacked in order under the condition that the semiconductor devices of the other semiconductor module units are inserted in the concave portion of the unit substrate so that through holes of each semiconductor module unit are conductively connected to one another through a second conductive connector.

3. The semiconductor module according to claim 1, wherein the depth of the concave portion or the through holes of the mother substrate is established to be a depth in which the semiconductor devices inserted in the concave portions or the through holes of said mother substrate are disposed back to back with a space between each semiconductor device and a bottom face of each concave portion of said mother substrate or with a space between the semiconductor devices.

4. The semiconductor module according to claim 2, wherein the depth of the concave portion of the unit substrate of the semiconductor module unit is established to be a depth in which one semiconductor device inserted in said concave portions of the unit substrate of one semiconductor module unit is disposed back to back with another semiconductor device of another semiconductor module unit with a space between the semiconductor devices.

5. A semiconductor module comprising:

plural semiconductor module units in which external terminals of semiconductor devices are packaged in electrode pads of a unit substrate on upper and lower faces of which electrode pads of a circuit pattern are disposed;

a mother substrate on upper and lower faces of which electrode pads of the circuit pattern is disposed and said plural semiconductor module units are vertically disposed; and a conductive connector for conductively connecting the electrode pads of the unit substrate conducting to said electrode pads packaged with the external terminals of said semiconductor devices and the electrode pads of said mother substrate.

6. The semiconductor module according to claim 1, wherein the semiconductor devices of the semiconductor module are CSP type semiconductor devices.

* * * * *